United States Patent [19]
Gilliland

[11] Patent Number: 5,812,717
[45] Date of Patent: Sep. 22, 1998

[54] OPTICAL PACKAGE WITH ALIGNMENT MEANS AND METHOD OF ASSEMBLING AN OPTICAL PACKAGE

[75] Inventor: Patrick B. Gilliland, Chicago, Ill.

[73] Assignee: Methode Electronics, Inc., Chicago, Ill.

[21] Appl. No.: 588,445

[22] Filed: Jan. 18, 1996

[51] Int. Cl.⁶ .................................................. G02B 6/36
[52] U.S. Cl. .................. 385/93; 385/92; 385/88
[58] Field of Search .......................................... 385/88–94

[56] References Cited

U.S. PATENT DOCUMENTS

| | | | |
|---|---|---|---|
| Re. 34,790 | 11/1994 | Musk | 385/93 |
| 4,979,791 | 12/1990 | Bowen et al. | 350/96 |
| 5,243,681 | 9/1993 | Bowen et al. | 385/14 |
| 5,257,336 | 10/1993 | Dautartas | 385/93 |
| 5,259,053 | 11/1993 | Schaffer et al. | 385/88 |
| 5,337,398 | 8/1994 | Benzoni et al. | 385/90 |
| 5,357,593 | 10/1994 | Bossler | 385/49 |
| 5,452,389 | 9/1995 | Tonai et al. | 385/93 X |

*Primary Examiner*—Phan T. H. Palmer
*Attorney, Agent, or Firm*—David L. Newman

[57] ABSTRACT

An optical package is provided having a diode mounted to a substrate enclosed by a housing which includes a bore for receiving an optical waveguide and a focusing element adjacent the bore. The bore and focusing element are aligned along a common optical axis. An alignment means is associated with the housing for aligning the substrate along the optical axis.

43 Claims, 5 Drawing Sheets

OPTICAL PACKAGE WITH ALIGNMENT MEANS AND METHOD OF ASSEMBLING AN OPTICAL PACKAGE

BACKGROUND OF THE INVENTION

This invention pertains generally to optical transceivers and, in particular, to a diode package for an optical transceiver.

Optical transceivers are known in the art and include active optical devices or diode packages. Common diode packages include LED packages such as a TO-46 package or a laser diode package such as RLD-85PC diode package by Rohm, Incorporated. These diode packages or TO cans typically include a metallic housing having a laser diode or LED for transmitting data and a photo diode for performing power-monitoring, metal contact leads exiting from the diodes for connection to a power source and a cover glass opposed to the diode, through which the energy is transmitted. The TO can is hermetically sealed. The hermetic sealing of the TO can is a time-consuming and expensive process which adds to the overall expense of the LED or laser package. As well, the commonly known TO cans do not have the emission area of the diode aligned within the TO can in a consistently centered orientation. Thus, placement of the TO can in a uniform position does not provide for alignment of the diode to an optical connector and maximum power transmission is not achieved. Thus, alignment of the TO package becomes a time-consuming and expensive process.

Commonly known housings for optical transceivers require complex mechanical means in order to align the diode package, the lens, the bore and the optical waveguide ferrule. Mechanical means, such as a screw is commonly used to actively align the TO can within the housing. Further, a molded plastic housing is often used having precision molded cavities specifically sized for receiving a diode package, another cavity specifically sized for receiving a lens and another cavity specifically sized for receiving an optical waveguide ferrule. Such an optical transceiver housing is often rendered ineffective in production due to variations in the alignment of the LED or laser relative to the TO can.

In view of the above, it is an object of the present invention to provide an optical package which is quickly and inexpensively manufactured.

It is another object of the present invention to provide a diode package which is quickly and inexpensively manufactured.

It is a further object of the present invention to provide a diode package which may be easily aligned with an optical transceiver housing.

It is another object of the present invention to provide an optical package having a single optical axis.

SUMMARY OF THE INVENTION

A principal object of this invention is to provide an optical package comprising a housing including a bore for receiving an optical waveguide and a focusing element adjacent the bore, the bore and the focusing element being aligned along a common optical axis, a diode mounted to a substrate adjacent the focusing element and an alignment means associated with the housing for aligning the substrate along the optical axis. The alignment means may include a trace located in a predetermined position on the substrate to which the housing is mounted. The alignment means may include a groove located in a predetermined position on the substrate to which the housing is mounted. The housing may include an outer sleeve defining the bore for receiving an optical waveguide and an inner sleeve for receiving the focusing element. The inner sleeve may include a lens support means for mounting the focusing element. The focusing element may be mounted in a lens support means. The lens support means may include a plastic washer having a bore of a diameter less than the diameter of the focusing element. The focusing element may be a ball lens. The groove may be formed between conductive traces adhered to the substrate. The groove may be integrally molded with the substrate. The bore may have a diameter of approximately 0.0984 inches or greater. The height of the inner sleeve may be less than the height of the outer sleeve. The inner sleeve may be partially filled with an optical filler composition. The alignment means may include a precision formed aperture in the housing for receiving the substrate. The substrate may be a precision formed material having a predetermined size and the diode mounted thereto in a predetermined orientation on the substrate. The focusing element may be integrally molded with the housing. The housing and the focusing element may be formed of a transmissive material allowing for the transmission of wavelengths from 780–1350 nanometers.

In an embodiment, an optical package is provided comprising a substrate having a diode mounted thereto and a groove formed in the substrate surrounding the diode, an inner sleeve mounted within the groove having a lens therein and an outer sleeve mounted to the substrate surrounding the inner sleeve for receiving an optical ferrule. The groove may be formed between conductive traces adhered to the substrate. The groove may be integrally molded with the substrate. The inner sleeve may include a tab protruding within the sleeve to provide support to the lens. The inner sleeve may be formed of stainless steel, brass, nickel silver or ARCAP®. The outer sleeve may have a cylindrical shape and include a bore having an inner diameter of 0.0984 inches or greater. The height of the inner sleeve may be less than the height of the outer sleeve. The diode may be a surface emitting diode. The diode may be an LED. The diode may be a vertical cavity surface emitting laser. The diode may be a photodiode. The inner sleeve may be partially filled with an optical filler composition. The optical filler composition may be an epoxy or a silicone composition. The optical filler composition may form a meniscus at the base of the lens to provide retention of the lens. The tabs of the inner sleeve may be formed from portions of the inner sleeve wall which are punched from the wall and protrude within the interior of the inner sleeve. The optical package may include a single optical axis wherein the diode has an emission point providing an emission axis upon which the lens and the ferrule are aligned.

In an embodiment, an optical package is provided comprising a substrate having an outer trace forming a circle and a pair of circular concentric inner traces formed within the outer trace and the pair of concentric inner traces defining a groove therebetween, an inner cylindrical sleeve mounted within the groove including a tab punched from the sidewall of the inner sleeve protruding toward the center of the cylindrical inner sleeve, a surface emitting diode and lens mounted within the inner sleeve and an outer cylindrical sleeve mounted on the outer trace defining an inner bore having a diameter of 0.0984 inches or greater and having a height greater than the inner sleeve. The inner traces may be formed from conductive copper traces. The diode may be mounted to the substrate. The lens may be a ball lens supported by the tab of the inner sleeve.

In an embodiment, an optical package is provided comprising a housing including a bore for receiving an optical waveguide, a focusing element adjacent the bore and a precision formed aperture for receiving a substrate, the bore, the focusing element and the aperture being aligned along a common optical axis and a diode mounted to the substrate. The substrate may be a precision formed material having a predetermined size and the diode mounted thereto in a predetermined orientation on the substrate. The substrate may be formed of a silicon material. The focusing element may be integrally molded with the housing.

A method of assembling an optical package is provided including the steps of forming a housing having a bore and a focusing element adjacent the bore, the focusing element and the bore aligned along a common optical axis, mounting a diode to a substrate in a predetermined position and mounting the substrate to the housing so that the diode is centered on the optical axis. The method further including the steps of forming an alignment means on the substrate or the housing and mounting the substrate to the housing via the alignment means. The method further including the steps of forming the alignment means of a precision aperture in the housing and receiving a precision formed substrate in the aperture.

The method further including the steps of forming a groove on a substrate surrounding a central point, mounting the diode at the central point of the substrate, mounting an inner sleeve within the groove, securing the inner sleeve to the substrate, mounting the focusing element within the inner sleeve, placing an outer sleeve on the substrate surrounding the inner sleeve, aligning the outer sleeve along the optical axis and securing the outer sleeve to the substrate. The method of assembling the optical package may include the step of injecting an optical filler composition into the inner sleeve after the lens is inserted therein. The method of assembling the optical package wherein the outer sleeve is mounted on an outer conductive trace adhered to the substrate and the outer sleeve is secured thereto via solder. The method of assembling an optical package wherein the outer sleeve may be integrally molded with the lens and inner sleeve. The method of assembling an optical package wherein the outer sleeve is actively aligned by inserting a ferrule of an optical waveguide attached to a power meter and to the bore of the outer sleeve, adjusting the outer sleeve laterally until a desired power level is achieved and securing the outer sleeve to the substrate.

These and other features of the invention are set forth below in the following detailed description of the presently preferred embodiments.

DETAILED DESCRIPTION OF THE
PRESENTLY PREFERRED EMBODIMENTS

Figure 1:
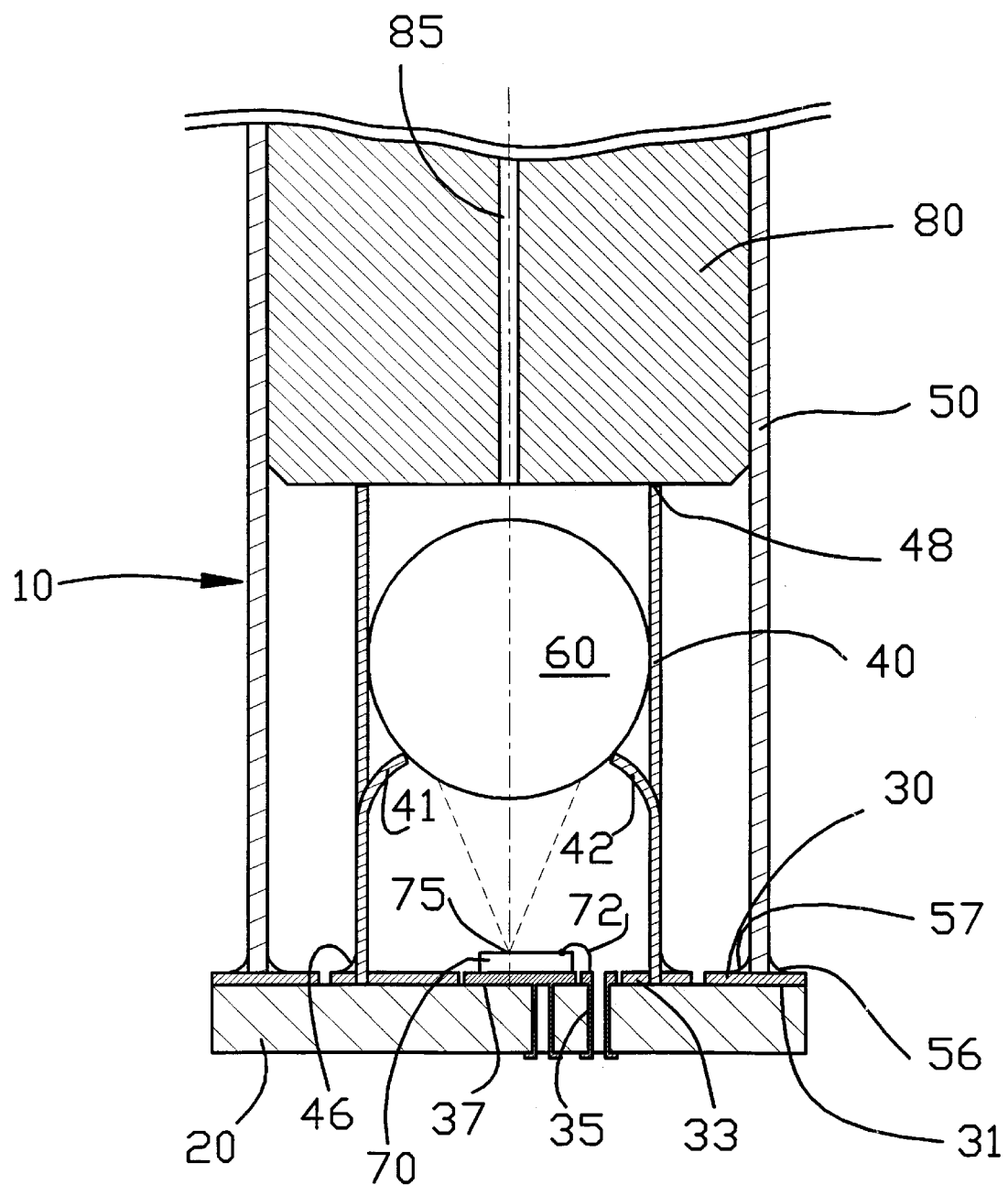
FIG. 1 is a side elevation cut-away view of the present invention.

The present invention, as shown in FIG. 1, relates to an optical package housing 10 comprising a substrate 20 having an alignment means such as traces 30 adhered thereto. Mounted to the substrate 20 is inner sleeve 40 and outer sleeve 50. Mounted within the inner sleeve 40 is ball lens 60 and optical device or diode 70. Received within the outer sleeve 50 is optical waveguide ferrule 80 including optical fiber 85. The present invention may be better understood by a description of a preferred embodiment of assembling the optical package housing 10. The substrate 20, for example, FR4, has traces 30, such as conductive four ounce copper traces adhered thereto. For example, a subtractive etching process or an additive process such as vacuum deposition may be used to pattern the substrate 20. The conductive traces 30 are adhered in a predetermined orientation providing for an outer trace 31, a sleeve groove 33 and also forming through-holes 35. The through-holes 35 provide retention points for the conductive traces 30 to avoid delamination of the conductive traces 30 from the substrate 20 when subjected to mechanical stress. In an alternate embodiment, through-holes 35 may provide an access point for injecting an optical filler composition such as an epoxy within the cavity of the inner sleeve 40 to provide for index matching or chip passivation. In an alternative embodiment, the substrate 20 may be a polymer material and the conductive traces 30 may be a conductive ink adhered thereto or the groove 33 may be integrally molded of the polymer material. The outer trace 31 and sleeve groove 33 provide for a means of aligning the optical package 10. The outer trace 31 and sleeve groove 33 are circular in order to receive the cylindrical outer sleeve 50 and cylindrical inner sleeve 40, respectively. The diode 70 is mounted to the conductive trace 37. In a preferred embodiment, a surface emitting LED is used. However, a laser or photodiode may be incorporated as well. The LED 70 receives its power from a pin inserted in through-hole 35 or a circuit trace on the backside of substrate 20 which is attached via a wire bond 72 to the diode 70. Also mounted to the substrate are the electronics to operate the optical device, for example, a driver circuit for a transmitter or an amplification and decision circuit for a receiver and connected to the LED or pin diode via conductive trace 37. Also, mounted to the substrate may be a power feedback means.

The inner sleeve 40 is assembled by forming lens support means, or tabs 41,42 from the sidewalls of the inner sleeve 40. In a preferred embodiment, the inner sleeve 40 is formed of a metallic material such as stainless steel, brass, nickel silver, or ARCAP®. The inner sleeve 40 is then mounted within sleeve groove 33 on the substrate 20. The groove 33 acts as an alignment means for the inner sleeve 40. The inner sleeve 40 is attached within the groove 33 by solder 46. A focusing element, such as a ball lens 60 is then placed within the sleeve 40 so that it rests on the distal ends of the tabs 41,42. The area of the inner sleeve 40 below the ball lens 60 is filled with an optical filler composition such as epoxy. The epoxy provides retention and support for the ball lens 60 beyond the tabs 41,42 and also protects the LED 70. The filler composition may also provide for an optical attenuator having a predetermined refractive index such as by using filled silicone or epoxy. Therefore, it may be understood that the ball lens 60 is maintained in its lateral and axially orientation within the inner sleeve 40 by the tabs 41,42 of the sleeve 40. In addition, the sleeve 40 may have an inner diameter equal to the outer diameter of the ball lens 60 so that a snug fit is achieved when the ball is inserted within the sleeve 40 so that it is supported at its bottom by the tabs 41,42 and at its equator by the sides of the sleeve 40. While a ball lens is a preferred light condensing element, other lenses may also be inserted within the sleeve 40.

The outer sleeve 50 is then mounted to the substrate 20. Generally, the outer sleeve 50 has a bore 51 having an inner diameter slightly greater than the diameter of a standard ferrule of 0.0984 inches. A ferrule 80 is then inserted within the bore of the outer sleeve 50. The optical waveguide, or ferrule 80 is inserted until it abuts the distal end 48 of the inner sleeve 40. The distal end 48 of the inner sleeve 40 prohibits the insertion of the ferrule any further. While the inner sleeve 40 is generally rigid, the ferrule 80 is generally mounted within a fiber optic connector having a spring to provide for axial compression of the ferrule 80 so that upon abutment with the distal end 48 of the inner sleeve 40, there is some compression provided to avoid damaging the end face of the ferrule 80. The distal end 48 of the inner sleeve 40 is formed as straight as possible so that abutment with the ferrule 80 acts to enclose the inner chamber of the inner sleeve 40 so that there are little or no gaps between the ferrule 80 and the distal end 48 of the inner sleeve 40. In any event, the ball lens 60 will focus the majority of the light emitted from the diode 70 toward the optical fiber 85 within the ferrule 80.

The optical package 10 is then actively aligned. The ferrule 80 is attached to a power meter and the outer sleeve 50 is moved laterally along the substrate 20 in order to find the optimum alignment position. Upon finding the optimal alignment position where the photons emitted from the emission point 75 of the LED or laser provide the highest power upon transmission through the optical fiber 85 of the ferrule 80, the outer sleeve 50 is secured in place. The outer sleeve 50 is secured to the outer trace 31 by solder 56,57 adhered along the bottom edge of the outer sleeve 50. Any standard means of applying solder may be used such as a solder gun or via solder pads adhered to the outer trace 31 or the substrate 20 and being exposed to heat such as infrared or hot air. The outer trace 31 acts as an alignment means for the outer sleeve 50. Therefore, it may be understood that an optical package 10 is provided which eliminates the need for a preassembled TO can and provides for an easily and inexpensively assembled and aligned package. In a preferred embodiment, the package has a single optical axis. As shown in FIG. 1, the emission axis from the emission point 75 of the optical element 70 is the same axis upon which the lens 60 and optical fiber 85 are aligned. This arrangement allows for the simple construction of the coaxial sleeves 40,50 of the present invention.

Figure 2:
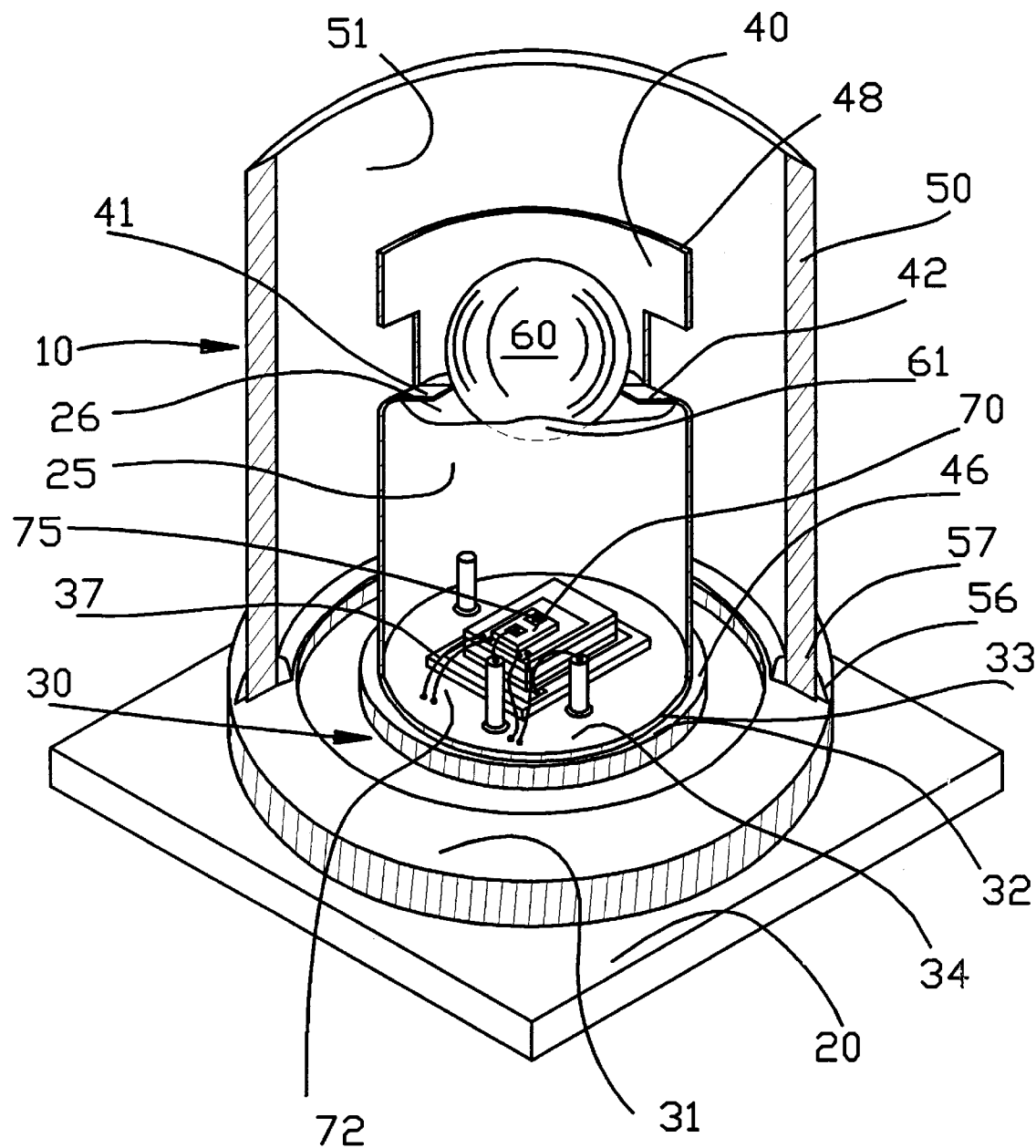
FIG. 2 is a perspective view of the present invention partially cut away.

Turning to FIG. 2, a perspective view of the invention is shown. The substrate 20 and traces 30 are shown in a complete view while the outer sleeve 50 and the inner sleeve 40 are shown partially cut away so that the present invention may be more easily viewed. Adhered to the substrate 20 is outer trace 31, and inner traces 32 and 34 which define sleeve groove 33. Also adhered to the substrate 20 is conductive pad 37. The conductive pad 37 has mounted thereto diode 70. In the embodiment shown in FIG. 2, the diode 70 is a vertical cavity surface emitting laser (VCSEL). The diode 70 receives power from wirebonds 72.

The inner sleeve 40 is mounted within sleeve groove 33 and secured within the groove 33 and to the traces 32,34 by a chemical bonding agent 46 such as epoxy or solder. Tabs 41,42 are punched out of the sides of the inner sleeve 40 so that they protrude generally perpendicular to the inner sleeve walls 40 toward the interior of the inner sleeve 40. The inner sleeve 40, in a preferred embodiment, forms a hollow cylinder except for the tabs 41,42 protruding toward the center of the cylinder. In a preferred embodiment, four tabs protrude into the cylinder in order to support the ball lens 60 therein. The ball lens 60 is mounted within the inner sleeve 40 and is supported by tabs 41,42. An optical filler composition 25 is injected into the bottom of the inner sleeve 40 in order to seal the diode 70 and support the ball lens 60 and secure it in a centered position along the optical axis above the emission point 75 of the diode 70. An optical filler composition such as an epoxy or optical silicone may be used. The filler composition 25 forms a meniscus 26 below the tabs 41,42 and above the base 61 of the ball lens 60. In accordance with the present invention, it can be understood that the mounting of the inner sleeve 40 as discussed above, is quickly and easily assembled and overcomes the need for an expensive component such as a TO-46 diode can. The mounting of the diode 70 to the substrate 20 and the inner sleeve 40 require alignment within approximately 0.003 inches of the optical axis of the optical package housing 10.

The precision alignment is performed by active alignment of the outer sleeve 50. The outer sleeve 50 is a cylindrical shell mounted on the circular outer trace 31. In a preferred embodiment, the outer sleeve 50 may be a solderable metallic material such as nickel silver, brass or ARCAP®. In an alternate embodiment, the outer sleeve 50 may be made of a polymer material such as Valox and may be molded integrally with the lens and inner sleeve which may also be a polymer material. The outer sleeve 50 includes a precision aligned bore 51 which may be polished. The bore 51 includes a diameter of approximately 0.0984 inches or greater to provide a low insertion force fit around a ferrule of an optical waveguide. Other ferrule diameters may also be accommodated by the bore 51 to allow for insertion of ferrules having a diameter of less than or greater than 0.0984 inches. Prior to securement of the outer sleeve 50 to the substrate 20, a ferrule is inserted within the bore 51 until it reaches the top edge 48 of the sleeve 40. The edge 48 acts as a stop-abutment to the ferrule.

The ferrule inserted within the bore 51 will be attached to an optical waveguide which is attached to a power meter in order to measure the power level being transmitted through the optical waveguide. The ferrule sleeve 50 is moved laterally on the substrate 20 which simultaneously moves the ferrule inserted within the bore 51 of the outer sleeve 50. The optical fiber position is adjusted along a transverse axis to a light beam or emission axis of the diode 70. Upon locating the outer sleeve 50 in a position achieving a satisfactory power level, the outer sleeve 50 is then secured to the substrate using solder or a chemical bonding composition. For example, an epoxy or solder 56,57 may be used. According to the above description, it may be understood that an optical transceiver apparatus may be easily, quickly and inexpensively manufactured. Such an apparatus may provide for transmission of light waves with a coupling efficiency in excess of 25% at an operating temperature between −40° and +85° celsius.

Figure 3:
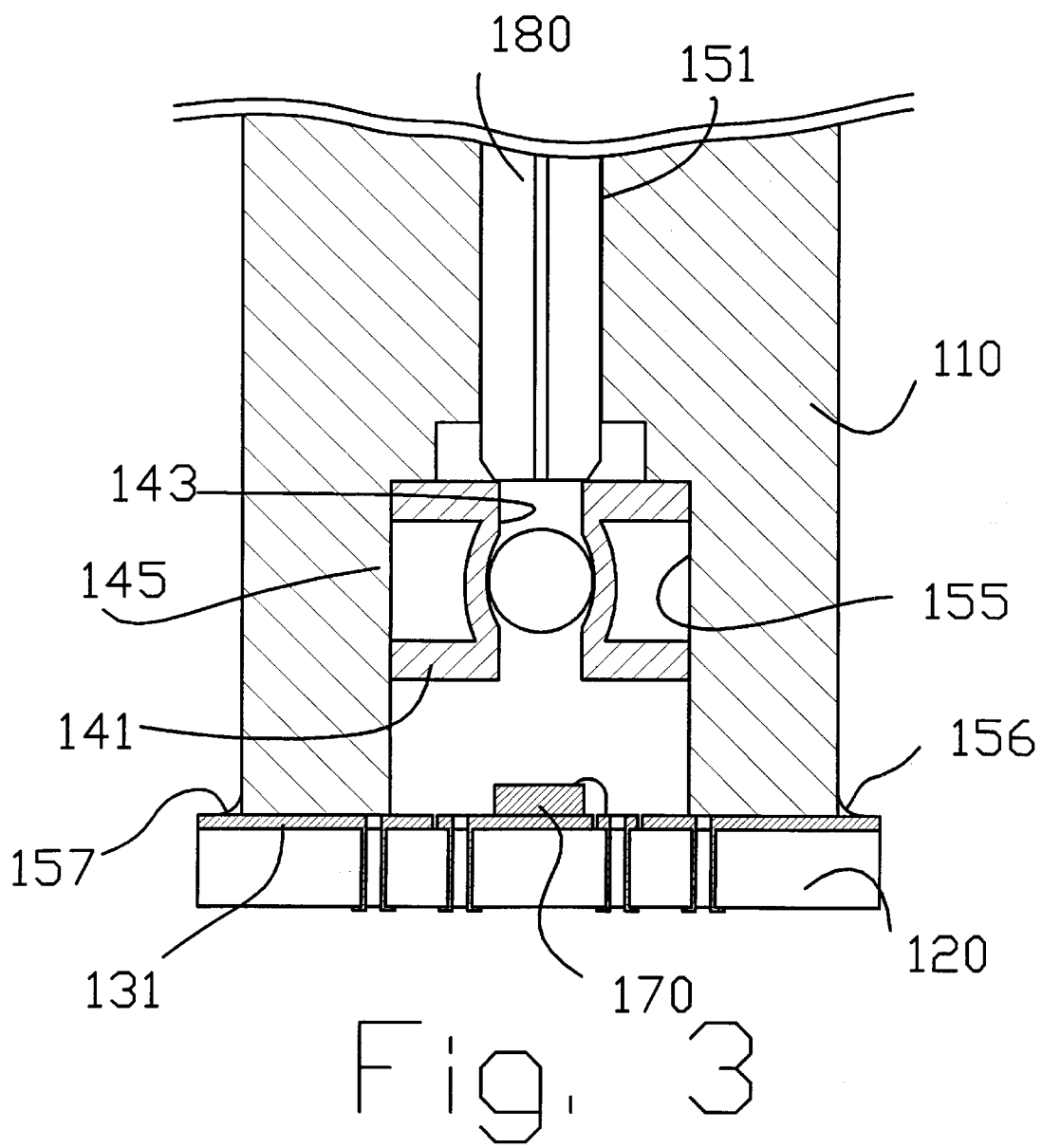
FIG. 3 is a side elevation cut-away view of an alternate embodiment of the present invention.

Turning to FIG. 3, an alternate embodiment of the present invention is shown having optical package housing 110 having a bore 151 for receiving ferrule 180. Adjacent the bore 151 is lower aperture 155. Mounted within the lower aperture 155 is lens support means 141. In this alternate embodiment, the lens support means 141 may be a washer made of a polymer material having an inner bore 143 having a length greater than the diameter of ball lens 160. In a preferred method of assembling the alternate embodiment shown in FIG. 3, the washer 141 is inserted within the aperture 155 so that it is adjacent the bore 151. A focusing element such as a ball lens 160 is inserted within the inner bore 143 of the washer 141. The inner bore 143 has a diameter slightly less than the diameter ball lens 161 so that the sidewalls 145 of the washer 141 expand upon insertion of the ball lens 160 therein. Therefore, it is preferred that a flexible polymer material such as SANTOPRENE™ (Advanced Elastomer Systems, L.P.) be used. The ball lens 160 may be inserted in the inner bore 143 of the washer 141 using an insertion tool. The washer 141 may be secured within the aperture 155 via chemical bonding means such as by epoxy. In addition, the force of the ball lens deforming the sidewalls 145 also causes the washer 141 to deform and frictionally abut the walls of the aperture 155 and aids in securing the washer 141 in position. The aperture 155 and the bore 151 are precision machined from a solderable material such as brass, nickel silver, or ARCAP® so that an optical waveguide 180 inserted within the bore 151 will be aligned along an optical axis which bisects the focusing element 160 mounted within the lens support means 141.

The optical package housing 110 is then mounted to a substrate 120 similar to that discussed above for the outer sleeve 50 as shown in FIGS. 1 and 2. The housing 110 is placed onto the substrate 120 so that the aperture 155 encloses the diode 170. The diode may include, but is not limited to, an LED, a VCSEL, a laser diode or a photodiode. The optical package is actively aligned by powering up the diode 170 and attaching the optical waveguide 180 to a power meter and moving the housing 110 laterally along the substrate 120 until an optimum reading is achieved. The housing 110 is preferably formed of a solderable material such as ARCAP® and the housing is soldered at solder points 156,157 to the alignment means or traces 131 of the substrate 120. The embodiment of FIG. 3 is an improvement over the embodiment of FIGS. 1 and 2 in that the housing 110 is a single unit which has the bore 151 and the lower aperture 155 formed of a single member. Therefore, it is not necessary to align both an outer and inner sleeve on a substrate.

A further alternate embodiment of the present invention may be understood with reference to FIG. 3 which provides for passive alignment. The substrate 120 may include along its upper surface a groove such as that shown in FIGS. 1 and 2, however, being precision formed to receive a protruding member from the housing 110. The substrate 120 may be precision formed such as by molding of a polymer substrate and the diode 170 may be precision aligned to the substrate. Upon mounting of the housing 110 to the substrate 120, the diode 170 will be passively precision aligned along a common single optical axis with the focusing element 160 and the bore 151. The focusing element 160 and the lens support means 141 may be both integrally molded with the housing 110, such as disclosed for FIGS. 4 and 5.

Figure 4:
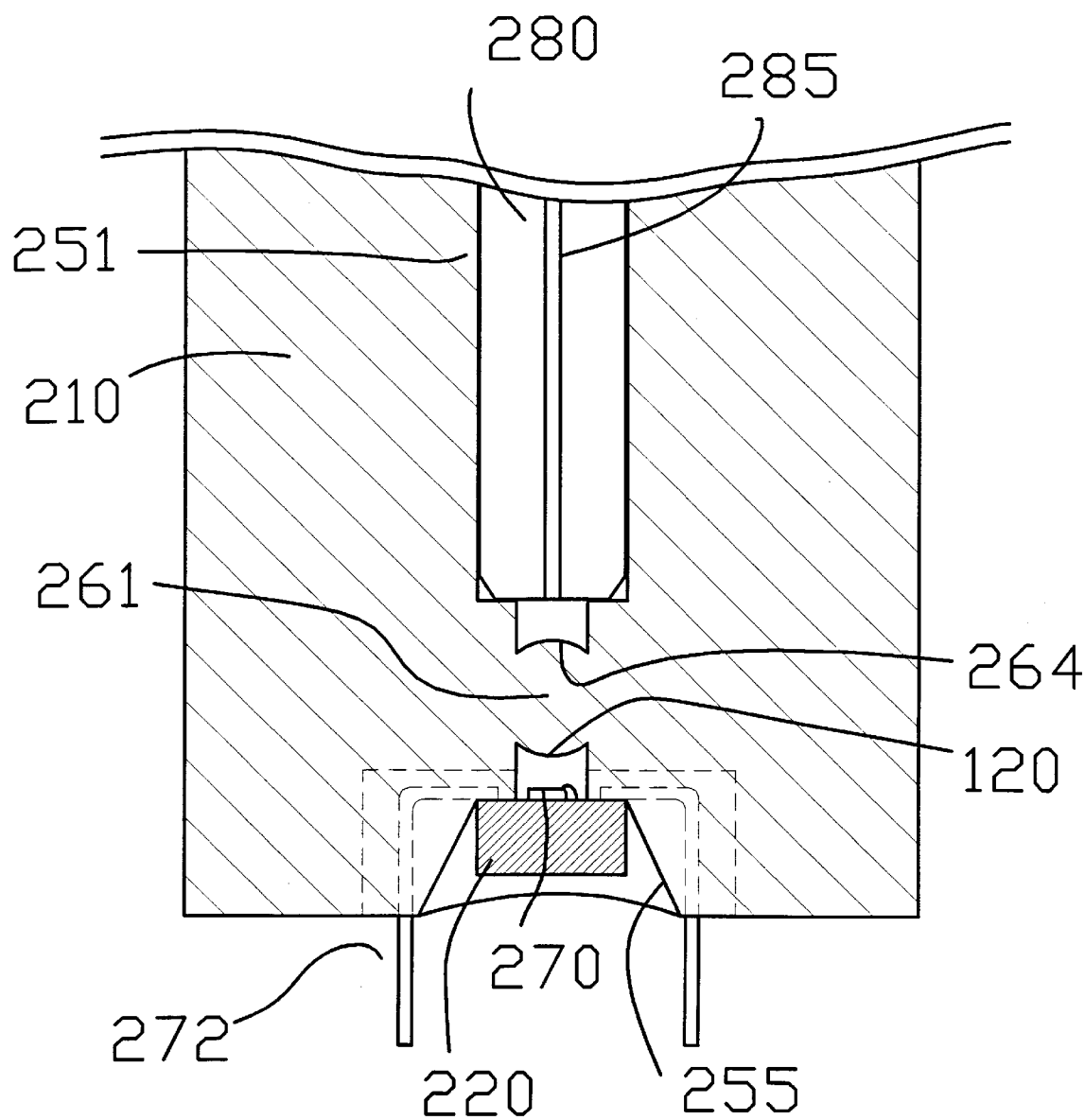
FIG. 4 is a side elevation cut-away view of another alternate embodiment of the present invention.

Turning to FIG. 4, another alternate embodiment of the present invention is shown having a housing 210 having a bore 251 for receiving an optical waveguide 280. Adjacent the bore 251 is a focusing element 260 and adjacent the focusing element 260 is an alignment means or precision formed lower aperture 255. In this alternate embodiment, the housing 210 is preferably formed of a transmissive material such as Ultem® and the focusing element 261 is integrally molded with the rest of the housing 210. The housing 210 is made of a material which allows for the transmission of lightwaves in the range of 780–1350 nanometers. The focusing element 261 includes a light refracting surface 263 and 264. Mounted within the aperture 255 is a substrate 220 which has mounted thereto a diode 270. The diode may include, but is not limited to, an LED, a VCSEL, a laser diode or photodiode. The substrate 220 is precision formed so that its dimensions are precisely formed to a predetermined size. The substrate 220 is preferably a silicon material which is anisotropically etched and cleaved to a predetermined size. The walls of the aperture 255 are also precision formed so that upon insertion of the substrate 220 within the aperture 255, the diode 270 which is also precision aligned on the substrate 220 will be aligned along an optical axis upon which the focusing element 261 and the bore 251 are centered. The aperture 255 of the housing 210 may be precision formed by any known methods, for example, using precision molding techniques including, injection molding, casting or precision grinding methods. The diode 270 is mounted on the silicon substrate using known methods of alignment, such as by infrared alignment means. This embodiment allows for passive alignment of the optical package. The substrate 220 is inserted within the aperture 255 so that it mounts in a predetermined, centered position. The emission point of the diode is centered on the optical axis so that the light waves of the diode strike refracting surface 263 of the focusing element 261. The light waves are then focused and transmitted from the refracting surface 264 of the focusing element 261 into the optical fiber 285 of the optical waveguide 280.

The substrate 220 may also have electronics to operate the optical device, including a driver circuit, an amplification and decision circuit and a power feedback means. The substrate 220 may be electrically connected via contacts 272 which may be mounted within the housing material 210 and have exposed portions adjacent the substrate 220 and the substrate may be soldered thereto. The substrate 220 may be secured within the aperture 255 via means such as chemical bonding, for example use of an epoxy composition. The embodiment shown in FIG. 4 discloses the diode 270 mounted on the substrate 220 adjacent the focusing element 261. Use of an epoxy or silicone compound "passivates" the LED or laser by creating a barrier to moisture and/or other corrosive agents.

Figure 5:
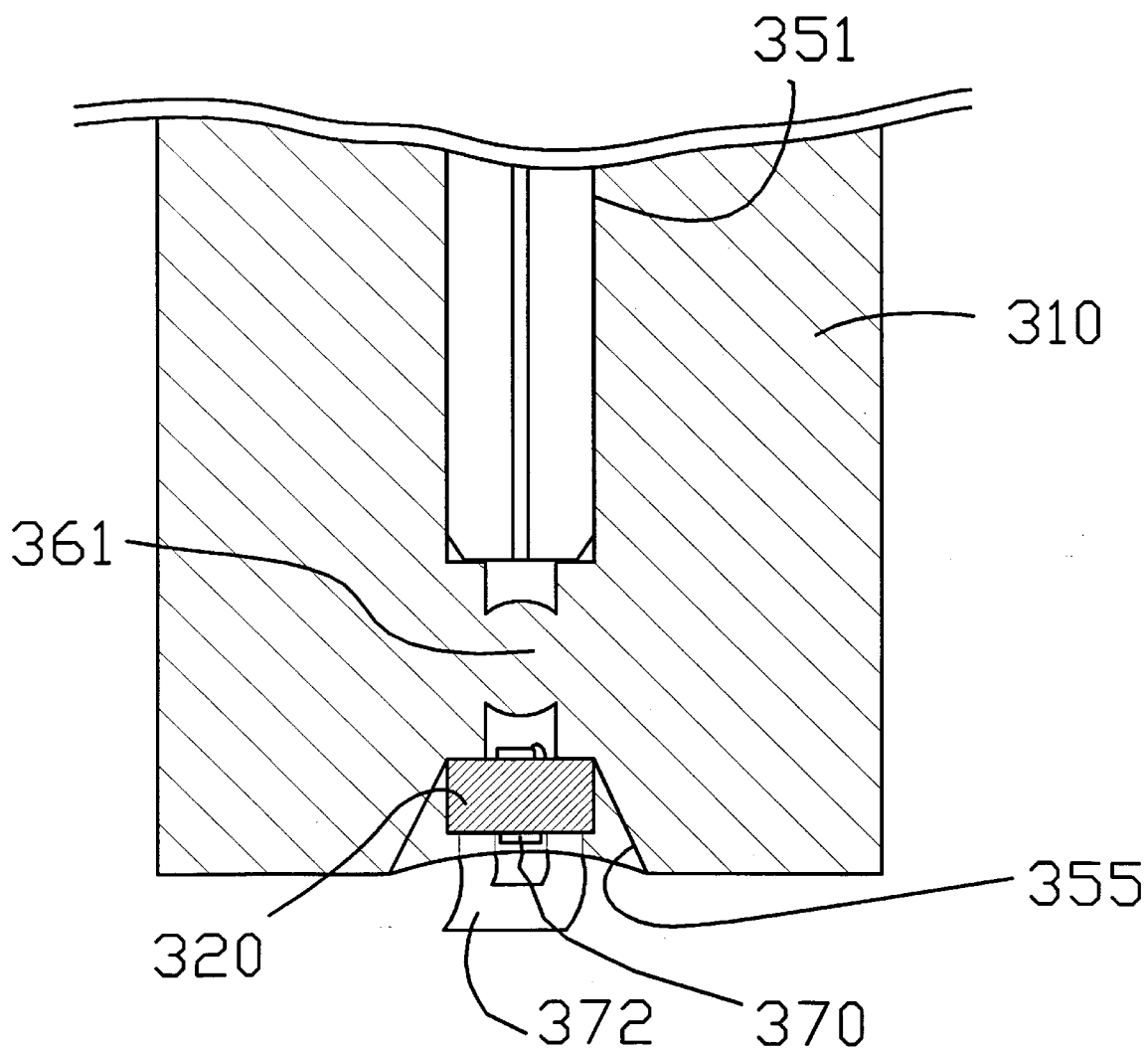
FIG. 5 is a side elevation cut-away view of a further alternative embodiment of the present invention.

Turning to FIG. 5, a further alternate embodiment is shown having the diode 370 mounted as a "flip chip" or on the surface of the substrate 320 opposite the surface which is adjacent the focusing element 360 so that the emission point is abutting the substrate and transmits therethrough. The diode may include, but is not limited to, an LED, a VCSEL, a laser diode or a photodiode. In such an orientation, the substrate 320 may have its electronics connected via flexible circuit member 372 to external components. In such an embodiment, the substrate 320 is preferably formed of a material which is optically transmissive and allows for the transmission of lightwaves of up to 780–1350 nanometers such as silicon or transparent glass. The embodiment of FIG. 5 also allows for passive alignment similar to the embodiment of FIG. 4 in that the substrate is positioned within aperture 355 so that the prepositioned diode 370 is aligned on the optical axis along with the focusing element 361 and the bore 351.

It should be understood that various changes and modifications to the presently preferred embodiments described herein will be apparent to those skilled in the art. Such changes and modifications may be made without departing from the spirit and scope of the present invention and without diminishing its attendant advantages. For example, the present invention may be manufactured as a pair of optical devices or an array of any desired number of such components. It is, therefore, intended that such changes and modifications be covered by the appended claims.

What is claimed is:

1. An optical package comprising:
   a housing including a bore for receiving an optical waveguide and a focusing element adjacent the bore, the bore and the focusing element being aligned along a common optical axis;

a diode mounted to a substrate adjacent the focusing element; and an alignment means associated with the housing for aligning the substrate along the optical axis and the alignment means includes a trace located in a predetermined position on the substrate to which the housing is mounted.

2. The optical package of claim 1 wherein the housing includes an outer sleeve defining the bore for receiving an optical waveguide and an inner sleeve for receiving the focusing element.

3. The optical package of claim 2 wherein the height of the inner sleeve is less than the height of the outer sleeve.

4. The optical package of claim 2 wherein the inner sleeve is partially filled with an optical filler composition.

5. The optical package of claim 2 wherein the inner sleeve includes a lens support means for mounting the focusing element.

6. The optical package of claim 1 wherein the alignment means includes a groove located in a predetermined position on the substrate to which the housing is mounted.

7. The optical package of claim 6 wherein the groove is formed between conductive traces adhered to the substrate.

8. The optical package of claim 6 wherein the groove is integrally molded with the substrate.

9. The optical package of claim 1 wherein the focusing element is mounted in a lens support means.

10. The optical package of claim 9 wherein the focusing element is a ball lens.

11. The optical package of claim 9 wherein the lens support means includes a plastic washer having a bore of a diameter less than the diameter of the focusing element.

12. The optical package of claim 1 wherein the focusing element is integrally molded with the housing.

13. The optical package of claim 12 wherein the housing and focusing element are formed of a transmissive material, allowing the transmission of wavelengths in the range of 780–1350 nanometers.

14. The optical package of claim 1 wherein the alignment means includes a precision formed aperture in the housing for receiving the substrate.

15. The optical package of claim 1 wherein the substrate is a precision formed material having a predetermined size and the diode mounted thereto in a predetermined orientation on the substrate.

16. The optical package of claim 1 wherein the bore has a diameter of approximately 0.0984 inches or greater.

17. The optical package of claim 1 wherein the diode is a photodiode.

18. The optical package of claim 1 wherein the diode is a surface emitting diode.

19. The optical package of claim 1 wherein the diode is an LED.

20. The optical package of claim 1 wherein the diode is a vertical cavity surface emitting laser.

21. An optical package comprising:
a substrate having a diode mounted thereto and a groove formed in the substrate surrounding the diode;
an inner sleeve mounted within the groove having a lens therein; and
an outer sleeve mounted to the substrate surrounding the inner sleeve for receiving an optical ferrule.

22. The optical package of claim 21 wherein the inner sleeve includes a tab protruding within the sleeve to provide support to the lens.

23. The optical package of claim 22 wherein the tab of the inner sleeve is formed from portions of the inner sleeve wall which are punched from the wall and protrude within the interior of the inner sleeve.

24. The optical package of claim 21 further comprising:
the substrate having an outer trace forming a circle and a pair of circular concentric inner traces formed within the outer trace and the pair of concentric inner traces defining a groove therebetween;
the inner sleeve mounted within the groove including a tab punched from the sidewall of the inner sleeve protruding toward the center of the inner sleeve;
a surface emitting diode mounted within the inner sleeve; and
the outer sleeve mounted on the outer trace defining an inner bore having a diameter of at least 0.0984 inches and having a height greater than the inner sleeve.

25. The optical package of claim 24 wherein the diode is mounted to the substrate.

26. The optical package of claim 21 wherein the substrate includes traces formed from conductive copper traces.

27. The optical package of claim 21 wherein the optical package includes a single optical axis wherein the diode has an emission point that provides an emission axis upon which the lens and the ferrule are aligned.

28. An optical package comprising:
a housing including a bore for receiving an optical waveguide, a focusing element adjacent the bore, and a precision formed aperture for receiving a substrate together providing alignment of the substrate to the aperture; the bore, the focusing element and the aperture being aligned along a common optical axis of the housing; and
a diode mounted to the substrate.

29. The optical package of claim 28 wherein the focusing element is integrally molded with the housing.

30. The optical package of claim 28 wherein the substrate is a precision formed material having a predetermined size and the diode mounted thereto in a predetermined orientation on the substrate.

31. The optical package of claim 28 wherein the substrate is formed of a silicon material.

32. A method of assembling an optical package including the steps of:
forming a housing including an inner sleeve and an outer sleeve and the housing having a bore and a focusing element adjacent the bore, the focusing element and the bore aligned along a common optical axis;
forming a groove on a substrate surrounding a central point;
mounting the diode at the central point of the substrate;
mounting the inner sleeve within the groove;
securing the inner sleeve to the substrate;
mounting the focusing element within the inner sleeve;
placing the outer sleeve on the substrate surrounding the inner sleeve;
aligning the outer sleeve along the optical axis; and
securing the outer sleeve to the substrate.

33. The method of claim 32 including the steps of forming an alignment means on the substrate or the housing and mounting the substrate to the housing via the alignment means.

34. A method of claim 33 including the steps of forming the alignment means of a precision aperture in the housing and receiving a precision formed substrate in the aperture.

35. The method of claim 32 including the steps of passively aligning the optical package by mounting a precision formed substrate having a precision oriented diode thereon within a precision formed aperture of the housing.

36. The method of claim 35 including the step of forming the precision formed substrate by anisotropically etching and cleaving a silicon material.

37. The method of claim 32 including the step of injecting an optical filler composition into the inner sleeve after the lens is inserted therein.

38. The method of claim 32 wherein the outer sleeve is mounted on an outer conductive trace adhered to the substrate and the outer sleeve is secured thereto via solder.

39. The method of claim 32 wherein the outer sleeve is integrally molded with the lens and inner sleeve.

40. The method of claim 32 including the steps of actively aligning the optical package by inserting a ferrule of an optical waveguide attached to a power meter into the bore of the outer sleeve;

adjusting the outer sleeve laterally until a desired power level is achieved; and securing the outer sleeve to the substrate.

41. An optical package comprising:

a housing including a bore for receiving an optical waveguide and a focusing element integrally molded with the housing and located adjacent the bore, the bore and the focusing element being aligned along a common optical axis;

a diode mounted to a substrate adjacent the focusing element; and an alignment means associated with the housing for aligning the substrate along the optical axis.

42. The optical package of claim 41 wherein the housing and focusing element are formed of a transmissive material, allowing for the transmission of wavelengths in the range of 780–1350 nanometers.

43. A method of assembling an optical package including the steps of:

forming a housing having a bore and a focusing element adjacent the bore, the focusing element and the bore aligned along a common optical axis;

forming a precision aperture in the housing;

mounting a diode to the substrate in a predetermined position; and mounting the substrate to the housing aperture so that the diode is centered on the optical axis.

* * * * *